United States Patent [19]

Tachi

[11] 4,406,733
[45] Sep. 27, 1983

[54] DRY ETCHING METHOD

[75] Inventor: Shinichi Tachi, Hachioji, Japan

[73] Assignee: Hitachi, Ltd., Tokyo, Japan

[21] Appl. No.: 451,956

[22] Filed: Dec. 21, 1982

[30] Foreign Application Priority Data

Jan. 22, 1982 [JP] Japan .................................. 57-7594

[51] Int. Cl.³ .......................................... H01L 21/306
[52] U.S. Cl. .................................. 156/643; 156/646;
156/657; 156/662; 204/192 E; 252/79.1
[58] Field of Search ............ 156/643, 646, 657, 659.1,
156/662; 252/79.1; 204/192 E

[56] References Cited

U.S. PATENT DOCUMENTS 4,352,724 10/1982 Sugishima et al. ............. 204/192 E Primary Examiner—William A. Powell
Attorney, Agent, or Firm—Antonelli, Terry & Wands

[57] ABSTRACT

In a dry etching method of etching Si, $PF_5$-gas is used as a source gas for plasma etching and reactive ion beam etching. The substrate can be etched at a higher rate as compared with the plasma etching in which $CF_4$-gas is used as the source gas.

5 Claims, 3 Drawing Figures

DRY ETCHING METHOD

BACKGROUND OF THE INVENTION

The present invention generally relates to a dry etching method. In particular, the invention concerns a plasma etching method and a reactive ion beam etching method which are advantageously suited for etching silicon.

In hitherto known dry etching methods, $CF_4$-gas is most usually employed. As the consequence, carbon and $CF_n$-polymers tend to be unwantedly deposited on the surface of a Si-wafer under etching. Another disadvantage is seen in that the etching rate is as low as of the order of 1000 A/min. More specifically, in the manufacture of semiconductor elements, $CF_4$l-gas has heretofore been used as a source gas in the process of dry-etching the substrate of Si, $SiO_2$ or the like. Upon etching, there are generated various ions in the $CF_4$-gas plasma. When ions $C^+$ and $CF^+$ among the generated ions impinge on the Si-wafer at an energy level in the ranges of 100–2200 eV and 100–700 eV, respectively, deposition of these substances take place on the surface of the Si-wafer, as is illustrated in FIG. 1, in which a broken curve represents behavior of the $C^+$ ion while a solid curve represents that of the $CF^+$ ion. In the case of the plasma etching process, it is mainly those ions whose energy lies in a range of 100 to 600 eV that impinge onto the workpiece, i.e. a semiconductor wafer. Consequently, in the etching process using only $CF_4$ as the discharge gas, it is impossible to attain a satisfactorily high etching rate due to the deposition. Under the circumstances, a small amount of $O_2$-gas or $H_2$-gas is usually added for the purpose of removing the deposition formed on the wafer surface.

By the way, in the manufacture of semiconductor elements, the etching process is often carried out with a photoresist pattern being used as a mask for the etching. Accordingly, when the amount of $O_2$ is increased, the photoresist pattern may undesirably be etched away. Further, the addition of $O_2$ and/or $H_2$ in a small amount makes no contribution to the solution of the problem of the low etching rate.

Dry-etching using $PCl_3$ was proposed and is known to exhibit anisotropic etching which depends on crystal orientation. Further the problem of deposition exists.

SUMMARY OF THE INVENTION

It is an object of the present invention to provide an etching method which allows silicon to be etched at an increased rate or yield and preferably without undercutting.

In view of the above and other objects which will become apparent as description proceeds, it is proposed according to a feature of the invention to use $PF_5$-gas as a source gas for the plasma etching and for the ion beam etching.

DESCRIPTION OF THE PREFERRED EMBODIMENTS

The present invention resides in an etching method which allows semiconductor wafers of Si to be etched at a higher rate or yield than the conventional one by using $PF_5$ gas as a source gas for the plasma etching and ion beam etching.

For realizing a high rate etching, it is required to remove material deposition formed on the surface of a Si wafer in the course of dry etching. As described hereinbefore, in the plasma etching using $CF_4$-gas, carbon and CF-polymers tend to be deposited on the wafer surface because of the incident ions $C^+$ and $CF^+$. In contrast to this, it has been discovered that substantially no deposition occurs when $PF_5$-gas is used as the source gas for the plasma etching. It has been found that high speed dry-etching can be attained by the use of $PF_5$-gas as the source gas for the plasma etching.

In carrying out the etching according to the invention, many of various hitherto known plasma etching apparatus may be made use of.

Figure 1:
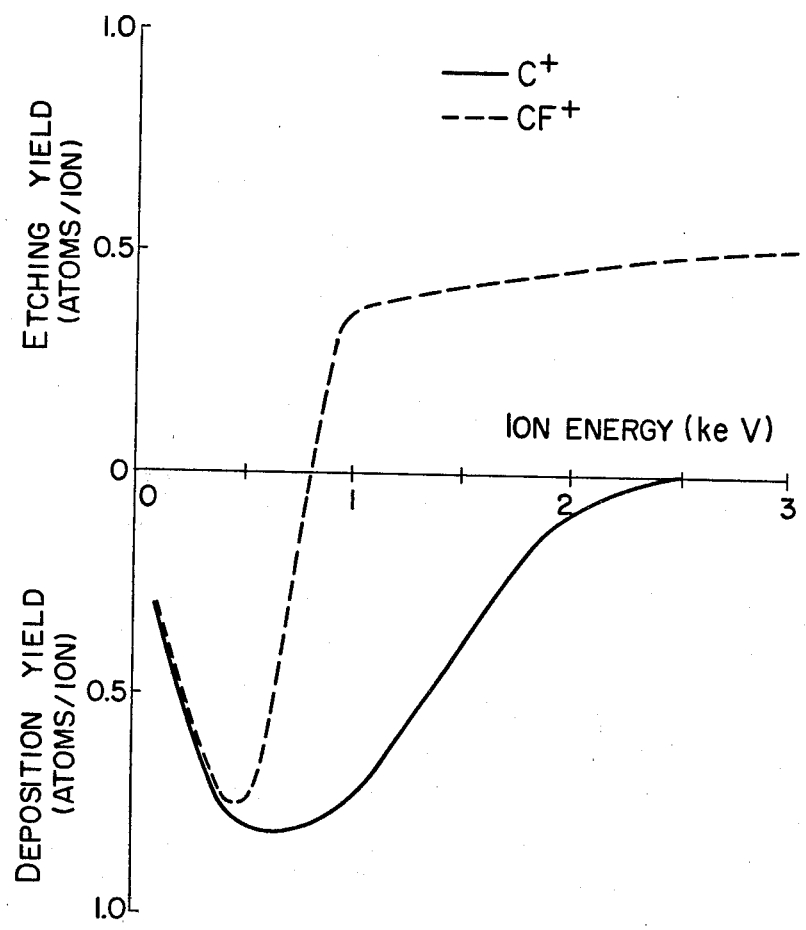
FIG. 1 is a graph for illustrating the dependency of etching yield (number of etched Si atoms per incident ion) and deposition yield on the incident ion energy, being depicted on the basis of data obtained when a Si-wafer was irradiated with ions $C^+$ and $CF^+$.
Figure 2:
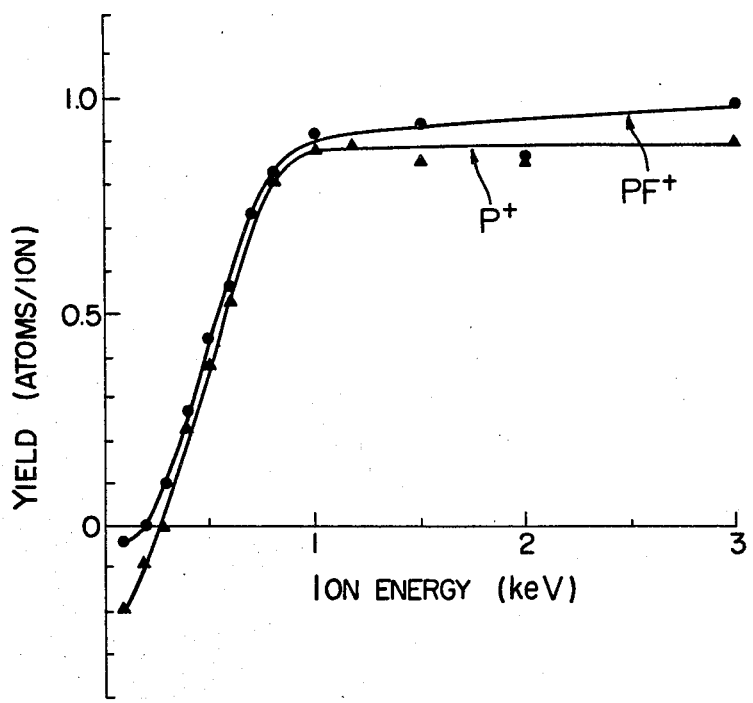
FIG. 2 is a graph for illustrating the dependency of the etching yield on the incident ion energy, being depicted on the basis of data obtained upon irradiation of a Si-wafer with ions $P^+$ and $PF^+$.

Now, the invention will be described in conjunction with an example illustrated graphically in FIG. 2 which shows the number of Si-atoms etched by a single incident ion as a function of the incident ion energy upon irradiation of a Si-wafer with ions $P^+$ and $PF^+$ produced in $PF_5$-gas plasma. The ions $P^+$ and $PF^+$, among the ions produced in the $PF_5$-gas plasma, are most likely to be deposited. However, it has surprisingly been found that substantially no deposition occurs in an ion energy range of above about 100 eV. Further, in the range from about 700 eV up to the measured highest energy of about 3000 eV, the etching yield was found to keep a high value. Other ions produced in the $PF_5$-gas plasma have shown substantially no tendency of deposition. It is possible to attain a high etching rate and without undercutting in the plasma etching by using $PF_5$-gas as the source gas. By way of example, a plasma etching of a Si-wafer was effected with the aid of a cathode coupled type radio frequency plasma etcher by using $PF_5$-gas. It has been found that the etching rate as high as 5000 A/min. is attained under the conditions that the gas pressure is 1.3 Pa with the input power being 400 W (power density, 1.5 W/cm$^2$). It has also been found that comparable etching rate of which is 2–5 times as large as the etching rate the $CF_4$ gas method could be attained in the cases where a microwave etcher and an ion beam etcher were employed. The preferred range of pressure of $PF_5$-gas depends, of course, on the types of the etching apparatus as employed. However, in general, the gas pressure range is from $10^{-3}$ to $10^3$ Pa and more preferably from 1 to 10 Pa. He-gas or Ar-gas may be used as a carrier gas.

Figure 3:
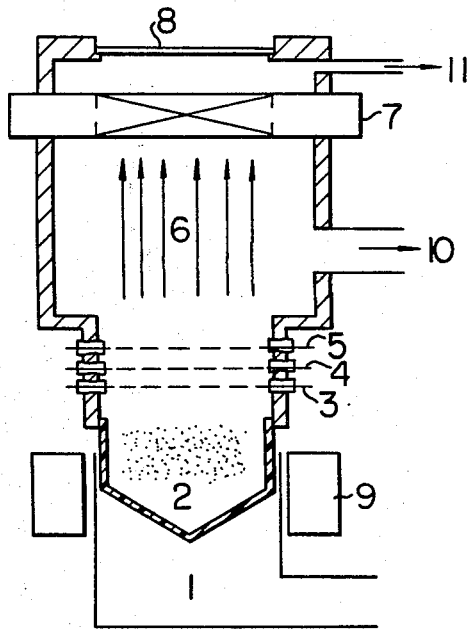
FIG. 3 shows a sectional view of a dry etching apparatus for single wafer processing.

The invention which thus allows the increased etching rate may advantageously be applied to a plasma etcher designed for the etching on the single wafer base (shown in FIG. 3) and a reactive ion beam etching apparatus with a view of enhancing the throughput of these apparatus. In the etching apparatus shown in FIG. 3, a gas plasma 2 is produced by a microwave ion source 1. Ions present in the produced plasma are extracted through extractor electrodes 3 and 4. A neutralized beam 6 emitted through a neutralizer electrode 5 is directed to a Si-wafer 8 for irradiation of one major surface thereof through a gate valve 7. The other surface of the Si-wafer 8 is exposed to the atmosphere. This apparatus is advantageous in that the wafer can be handled in a facilitated manner. In FIG. 3, reference numeral 9 denotes a magnet, and 10 and 11 denote exhaust ports, respectively.

It can be estimated that phosphorus, even when deposited temporarily on silicon, will evaporate in the form of $PF_3$. In contrast to this, phosphorus in $PCl_3$ etching will only escape in the form of $PCl_3$, leaving the problem of deposition.

Yet, there is also some effect of phosphorus in the silicon body etched by $PF_5$. Such effect, however, can be easily eliminated by slightly removing (etching) a surface layer. Alternatively, phosphorus in the etched silicon body may be activated to positively use the resultant region as a channel stopper or the like.

What is claimed is:

1. A dry etching method, wherein $PF_5$-gas is used as a source gas for producing plasma for etching a semiconductor substrate.

2. A dry etching method according to claim 1, wherein pressure of said $PF_5$-gas is in a range of $10^{-3}$ to $10^3$ Pa.

3. A dry etching method according to claim 1, wherein He or Ar is used as a carrier gas in addition to said $PF_5$-gas.

4. A dry etching method according to claim 1, wherein said plasma is produced by a cathode coupled type radio frequency plasma etcher.

5. A dry etching method according to claim 1, wherein said ion beam is produced by a reactive ion beam etcher.

* * * * *